US009310698B2

(12) United States Patent
Menchtchikov et al.

(10) Patent No.: US 9,310,698 B2
(45) Date of Patent: Apr. 12, 2016

(54) METHOD AND APPARATUS FOR CONTROLLING A LITHOGRAPHIC APPARATUS

(75) Inventors: Boris Menchtchikov, Eindhoven (NL); Alexander Viktorovych Padiy, Geldrop (NL)

(73) Assignee: ASML Netherlands B.V., Veldhoven (NL)

( * ) Notice: Subject to any disclaimer, the term of this patent is extended or adjusted under 35 U.S.C. 154(b) by 1032 days.

(21) Appl. No.: 13/012,386

(22) Filed: Jan. 24, 2011

(65) Prior Publication Data
US 2011/0205510 A1    Aug. 25, 2011

Related U.S. Application Data

(60) Provisional application No. 61/306,111, filed on Feb. 19, 2010.

(51) Int. Cl.
*G03F 7/20*    (2006.01)

(52) U.S. Cl.
CPC ............ *G03F 7/70633* (2013.01); *G03F 7/705* (2013.01); *G03F 7/70525* (2013.01)

(58) Field of Classification Search
CPC .. G03F 7/705; G03F 7/70525; G03F 7/70633
USPC .......................... 355/52, 53, 55, 67; 250/548; 356/399–401
See application file for complete search history.

(56) References Cited

U.S. PATENT DOCUMENTS

| 5,117,255 | A | 5/1992 | Shiraishi et al. |
| 6,238,851 | B1 * | 5/2001 | Nishi ............................ 430/394 |
| 7,283,237 | B2 | 10/2007 | Sezginer et al. |
| 7,619,737 | B2 | 11/2009 | Mos et al. |
| 7,683,351 | B2 | 3/2010 | Mos et al. |

(Continued)

FOREIGN PATENT DOCUMENTS

| CN | 101221364 A | 7/2008 |
| CN | 101231472 A | 7/2008 |

(Continued)

OTHER PUBLICATIONS

English-Language Abstract for Taiwanese Patent Publication No. 200746253 A, published Dec. 16, 2007; 1 page.

*Primary Examiner* — Toan Ton
*Assistant Examiner* — Mona M Sanei
(74) *Attorney, Agent, or Firm* — Sterne, Kessler, Goldstein & Fox P.L.L.C.

(57) ABSTRACT

A lithographic exposure process is performed on a substrate using a scanner. The scanner comprises several subsystems. There are errors in the overlay arising from the subsystems during the exposure. The overlay errors are measured using a scatterometer to obtain overlay measurements. Modeling is performed to separately determine from the overlay measurements different subsets of estimated model parameters, for example field distortion model parameters, scan/step direction model parameters and position/deformation model parameters. Each subset is related to overlay errors arising from a corresponding specific subsystem of the lithographic apparatus. Finally, the exposure is controlled in the scanner by controlling a specific subsystem of the scanner using its corresponding subset of estimated model parameters. This results in a product wafer being exposed with a well controlled overlay.

13 Claims, 6 Drawing Sheets

(56) References Cited

U.S. PATENT DOCUMENTS

| | | |
|---|---|---|
| 7,718,327 B2 | 5/2010 | Okita |
| 2002/0071112 A1* | 6/2002 | Smith et al. ............. 356/124 |
| 2002/0191165 A1 | 12/2002 | Baselmans et al. |
| 2003/0035090 A1 | 2/2003 | Imai et al. |
| 2005/0243309 A1 | 11/2005 | Smith et al. |
| 2006/0114436 A1* | 6/2006 | Oesterholt et al. ......... 355/55 |
| 2007/0212856 A1 | 9/2007 | Owen |
| 2008/0174753 A1* | 7/2008 | Mos et al. .................. 355/53 |
| 2008/0252870 A1 | 10/2008 | Jeunink et al. |
| 2009/0213351 A1 | 8/2009 | Kok |
| 2009/0231569 A1 | 9/2009 | Maeda |
| 2010/0112467 A1* | 5/2010 | Chung ........................ 430/30 |

FOREIGN PATENT DOCUMENTS

| | | |
|---|---|---|
| EP | 1 628 164 A2 | 2/2006 |
| JP | 4-134813 A | 5/1992 |
| TW | 200746253 A | 12/2007 |
| WO | WO 2007/086316 A1 | 8/2007 |
| WO | WO 2010/006935 A2 | 1/2010 |

* cited by examiner

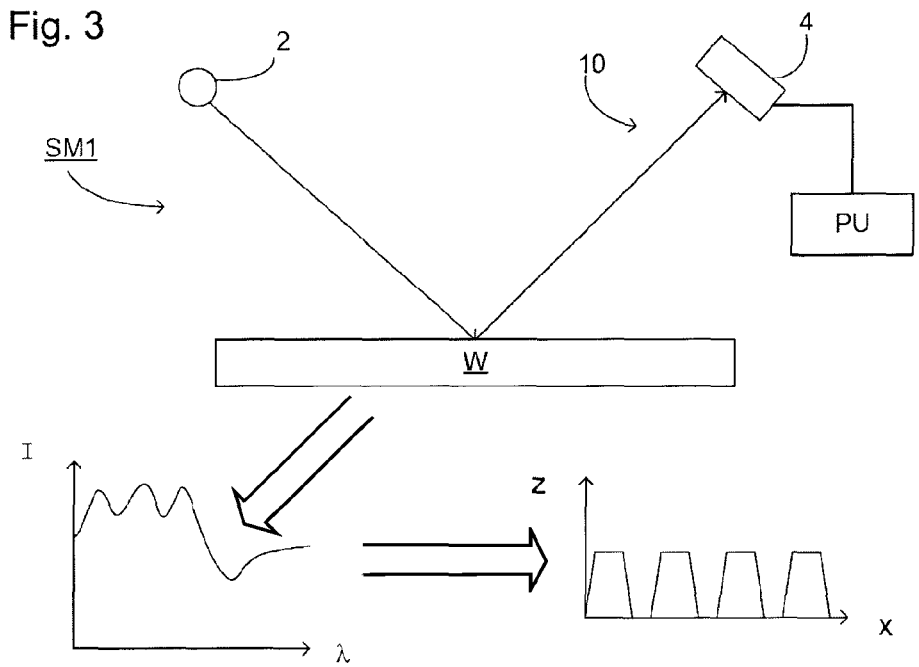
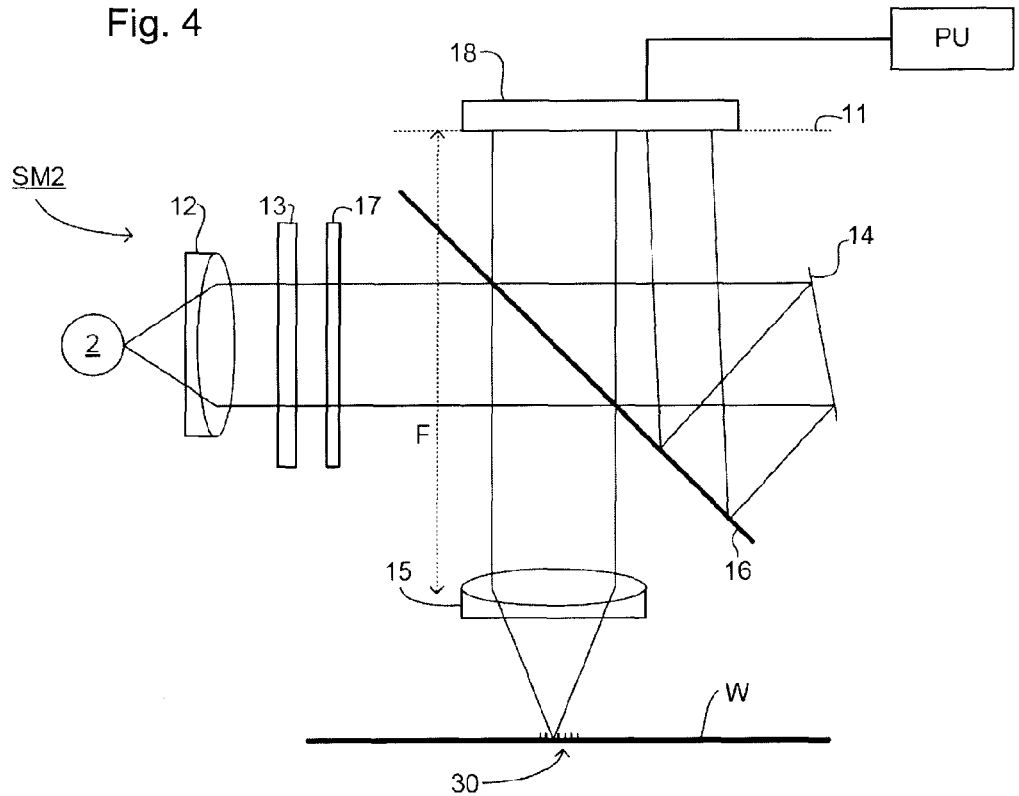

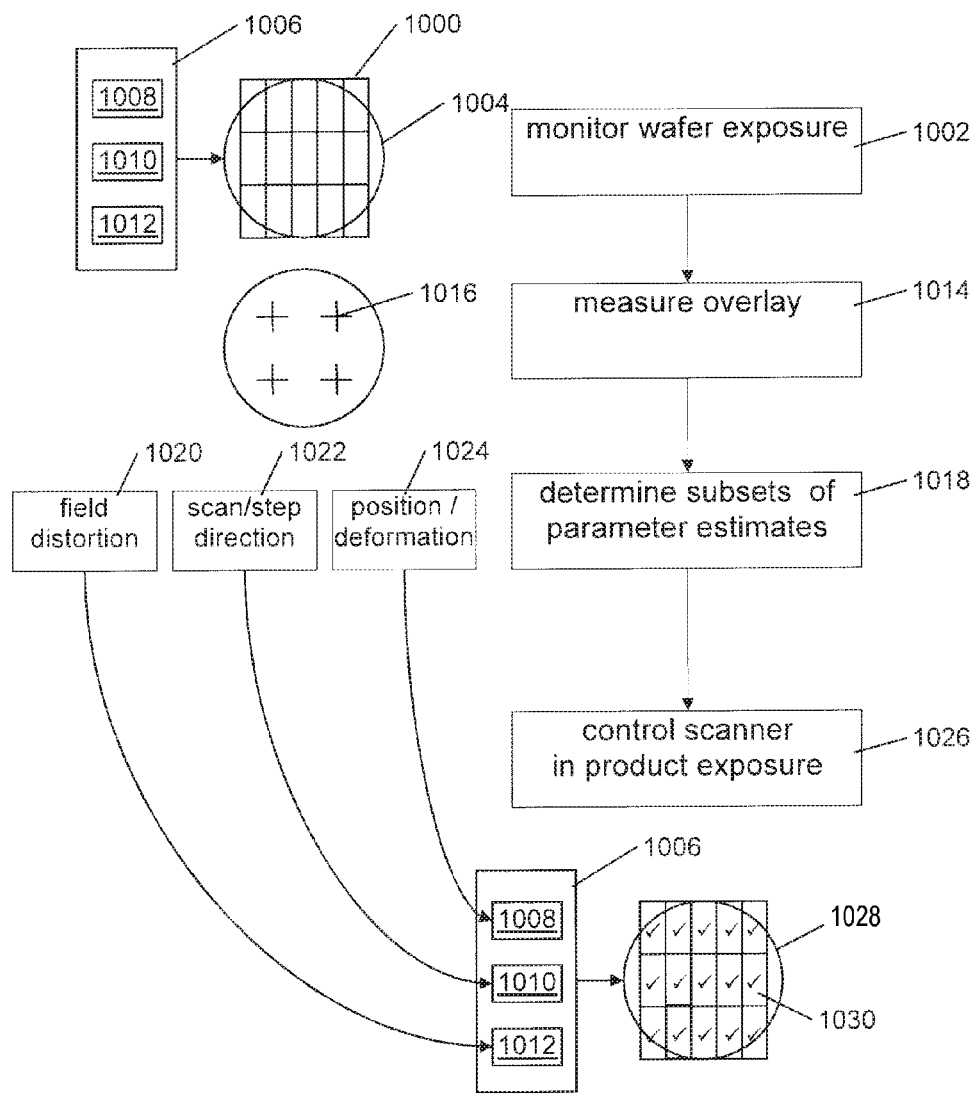

METHOD AND APPARATUS FOR CONTROLLING A LITHOGRAPHIC APPARATUS

CROSS REFERENCE TO RELATED APPLICATIONS

This claims benefit under 35 U.S.C. 119(e) to U.S. Provisional Patent Application No. 61/306,111, filed Feb. 19, 2010, which is incorporated by reference herein in its entirety.

BACKGROUND

1. Field of the Invention

The present invention relates to controlling lithographic apparatus for correcting errors, such as overlay, in the lithographic process usable, for example, in the manufacture of devices by lithographic techniques.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning" direction) while synchronously scanning the substrate parallel or anti parallel to this direction In order to monitor the lithographic process, parameters of the patterned substrate are measured. Parameters may include, for example, the overlay error between successive layers formed in or on the patterned substrate and critical line width of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Two main types of scatterometer are known. Spectroscopic scatterometers direct a broadband radiation beam onto the substrate and measure the spectrum (intensity as a function of wavelength) of the radiation scattered into a particular narrow angular range. Angularly resolved scatterometers use a monochromatic radiation beam and measure the intensity of the scattered radiation as a function of angle.

Typically, properties of the substrate such as overlay errors on a wafer are measured across the exposure field and across the wafer substrate. Overlay errors are not controlled at each and every measurement point. Rather, a parameterization is used to characterize overlay across the field and wafer.

This parameterization describes the overlay errors as a function of wafer and field position. This parameterization can be simple, such as a 10-parameter model, or more complex, such as a basis set of high order polynomials. Using this parameterization, the corrections can be calculated that should be applied at the lithography apparatus with the aim of driving overlay errors across the wafer (field) to zero.

Currently, off-line parameterization models consider overlay errors in a generic way. This can lead to ineffective maintenance by applying non-optimum corrections at the lithographic apparatus. Inaccuracy of this maintenance results in the need to perform more frequent on-line re-calibration of the lithographic apparatus or leads to specific corrections for field positions and size of the calibration that are not generic for other field positions and sizes (calibration vs. production layouts).

SUMMARY

Therefore, what is needed is an effective system and method of improved off-line parameterization modeling.

In an embodiment of the present invention, there is provided a method of controlling a lithographic apparatus that comprises measuring a substrate property arising from said lithographic process to obtain substrate property measurements and separately determining a variety of subsets of estimated model parameters of the lithographic apparatus from the substrate property measurements. In addition, each subset is related to errors in the substrate property arising from a corresponding specific subsystem of the lithographic apparatus. Further, control of the lithographic apparatus includes controlling a specific subsystem of the lithographic apparatus using the controlled specific subsystem's corresponding subset of estimated model parameters.

In another embodiment of the present invention, there is provided an apparatus for controlling lithographic processing by a lithographic apparatus used to perform a lithographic process on a substrate, where the apparatus includes an inspection apparatus for measuring a substrate property arising from the lithographic process to obtain substrate property measurements, and a processor to separately determine a variety of subsets of estimated model parameters of the lithographic apparatus from the substrate property measurements. In addition, each subset is related to errors in said substrate property arising from a corresponding specific subsystem of the lithographic apparatus. Further, control of the lithographic apparatus includes controlling a specific subsystem of the lithographic apparatus using the controlled specific subsystem's corresponding subset of estimated model parameters.

In a further embodiment of the present invention, there is provided a computer program product containing one or more sequences of machine-readable instructions for controlling lithographic processing by a lithographic apparatus used to perform a lithographic process on a substrate, where the instructions are adapted to cause one or more processors to receive substrate property measurements arising from the lithographic process, and to separately determine a variety of subsets of estimated model parameters of the lithographic apparatus from the substrate property measurements. In addition, each subset is related to errors in the substrate property arising from a corresponding specific subsystem of the lithographic apparatus. Further, control of the lithographic apparatus includes controlling a specific subsystem of the lithographic apparatus using the controlled specific subsystem's corresponding subset of estimated model parameters.

Further embodiments, features, and advantages of the present invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate the present invention, and, together with the description, further serve to explain the principles of the invention and to enable a person skilled in the relevant art(s) to make and use the invention.

FIG. 3 depicts a first scatterometer, according to an embodiment of the present invention.

FIG. 4 depicts a second scatterometer, according to an embodiment of the present invention.

FIG. 10 is a flow chart illustrating the method, according to an embodiment of the present invention.

Figure 1:
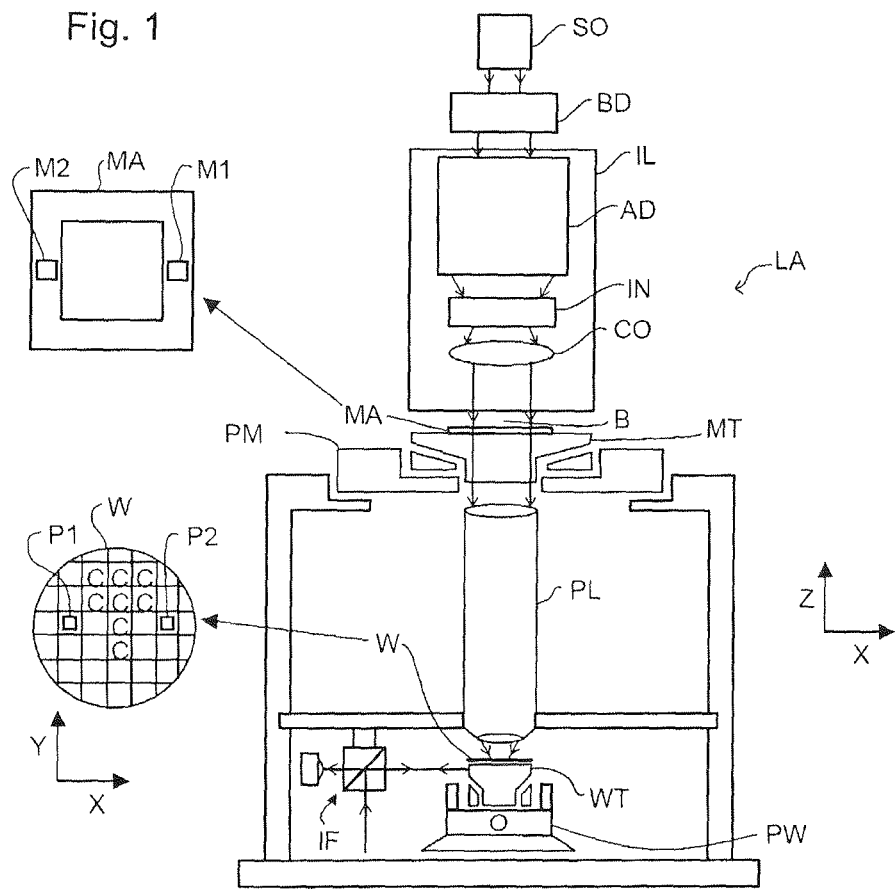
FIG. 1 depicts a lithographic apparatus, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

FIG. 1 schematically depicts a lithographic apparatus, according to an embodiment of the present invention. The apparatus includes an illumination system (illuminator) IL configured to condition a radiation beam B (e.g., UV radiation or DUV radiation); a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PL configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing various types of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

In this embodiment, for example, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables and for example, two or more mask tables. In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent, which are commonly referred to as σ-outer and σ-inner, respectively, of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PL, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module, e.g., coarse positioning, and a short-stroke module, e.g., fine positioning, which form part of the first positioner PM. Similarly, movement of the substrate table WT may be realized using a long-stroke module and a short-stroke module, which form part of the second positioner PW. In the case of a stepper, as opposed to a scanner, the mask table MT can be connected to a short-stroke actuator only, or may be fixed. Mask MA and substrate W may be aligned using mask alignment marks M1, M2, and substrate alignment marks P1, P2. Although the substrate alignment marks as illustrated occupy dedicated target portions, they may be located in spaces between target portions, which are known as scribe-lane alignment marks. Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
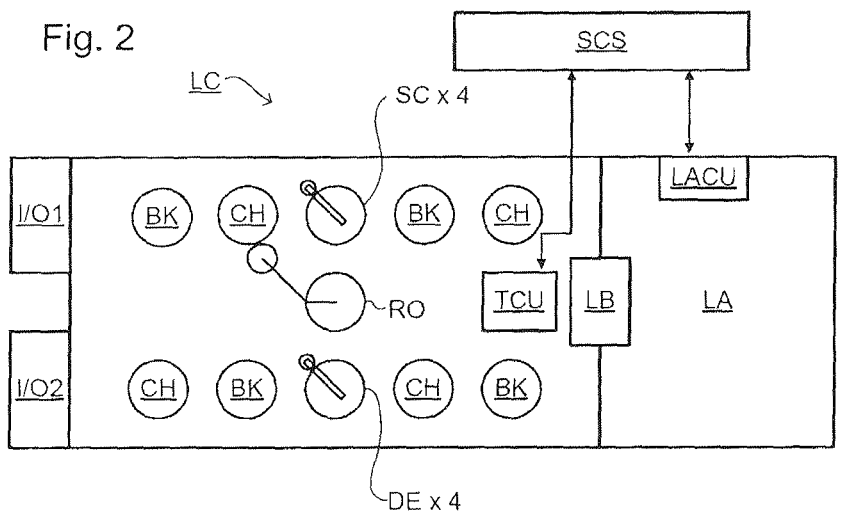
FIG. 2 depicts a lithographic cell or cluster, according to an embodiment of the present invention.

As shown in FIG. 2, according to an embodiment of the present invention, the lithographic apparatus LA forms part of a lithographic cell LC, also sometimes referred to a lithocell or cluster, which also includes apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU that is itself controlled by the supervisory control system SCS, which also controls the lithographic apparatus via lithography control unit LACU. Thus, the different apparatus can be operated to maximize throughput and processing efficiency.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. If errors are detected, adjustments for example, may be made to exposures of subsequent substrates, especially if the inspection can be done soon and fast enough that other substrates of the same batch are still to be exposed. Also, already exposed substrates may be stripped and reworked to improve yield or to possibly be discarded, thereby avoiding performing exposures on substrates that are known to be faulty. In a case where only some target portions of a substrate are faulty, further exposures can be performed only on those target portions that are deemed to be non-faulty.

An inspection apparatus is used to determine the properties of the substrates, and in particular, how the properties of different substrates or different layers of the same substrate vary from layer to layer. The inspection apparatus may be integrated into the lithographic apparatus LA or the lithocell LC or may be a stand-alone device. To enable most rapid measurements, it is desirable that the inspection apparatus measure properties in the exposed resist layer immediately after the exposure. However, the latent image in the resist has a very low contrast, as in there is only a very small difference in refractive index between the parts of the resist that have been exposed to radiation and those that have not, and not all inspection apparatus have sufficient sensitivity to make useful measurements of the latent image. Therefore measurements may be taken after the post-exposure bake step (PEB) that is customarily the first step carried out on exposed substrates and increases the contrast between exposed and unexposed parts of the resist. At this stage, the image in the resist may be referred to as semi-latent. It is also possible to make measurements of the developed resist image at which point either the exposed or unexposed parts of the resist have been removed or after a pattern transfer step such as etching. The latter possibility limits the possibilities for rework of faulty substrates but may still provide useful information.

FIG. 3, according to an embodiment of the present invention, depicts a scatterometer that may be used in the present invention. It comprises a broadband, e.g., white light, radiation projector 2 that projects radiation onto a substrate W. The reflected radiation is passed to a spectrometer detector 4, which measures a spectrum 10, e.g., intensity as a function of wavelength, of the specular reflected radiation. From this data, the structure or profile giving rise to the detected spectrum may be reconstructed by processing unit PU, e.g., by Rigorous Coupled Wave Analysis and non-linear regression or by comparison with a library of simulated spectra as shown at the bottom of FIG. 3. In general, for the reconstruction the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

Another scatterometer that may be used with the present invention is shown in FIG. 4, according to an embodiment of the present invention. In this device, the radiation emitted by radiation source 2 is collimated using lens system 12 and transmitted through interference filter 13 and polarizer 17, reflected by partially reflected surface 16 and is focused onto substrate W via a microscope objective lens 15, which has a high numerical aperture (NA), for example, preferably at least about 0.9, and more preferably at least about 0.95. Immersion scatterometers may even have lenses with numerical apertures over 1. The reflected radiation then transmits through partially reflecting surface 16 into a detector 18 in order to have the scatter spectrum detected. The detector may be located in the back-projected pupil plane 11, which is at the focal length of the lens system 15, however the pupil plane may instead be re-imaged with auxiliary optics (not shown) onto the detector. The pupil plane is the plane in which the radial position of radiation defines the angle of incidence and the angular position defines azimuth angle of the radiation. In one example, the detector is a two-dimensional detector so that a two-dimensional angular scatter spectrum of a substrate target 30 can be measured. The detector 18 may be, for example, an array of CCD or CMOS sensors, and may use an integration time of, for example, 40 milliseconds per frame.

A reference beam is often used, for example, to measure the intensity of the incident radiation. To do this, when the radiation beam is incident on the beam splitter 16 part of it is transmitted through the beam splitter as a reference beam towards a reference mirror 14. The reference beam is then projected onto a different part of the same detector 18 or alternatively on to a different detector (not shown).

A set of interference filters 13 is available to select a wavelength of interest in the range of, for example, 405-790 nm or even lower, such as 200-300 nm. The interference filter may be tunable rather than comprising a set of different filters. A grating could be used instead of interference filters.

The detector 18 can measure the intensity of scattered light at a single wavelength, or in a narrow wavelength range, the intensity separately at multiple wavelengths or integrated over a wavelength range. Furthermore, the detector can separately measure the intensity of transverse magnetic, and transverse electric, polarized light and/or the phase difference between the transverse magnetic and the transverse electric polarized light.

Using a broadband light source, i.e., one with a wide range of light frequencies or wavelengths, and therefore a wide range of colors is possible, which gives a large etendue, allowing the mixing of multiple wavelengths. The plurality of wavelengths in the broadband preferably each has a bandwidth of $\Delta\lambda$ and a spacing of at least 2 $\Delta\lambda$ (i.e., twice the bandwidth). A plurality of "sources" of radiation can be different portions of an extended radiation source that have been split using fiber bundles. In this way, angle resolved scatter spectra can be measured at multiple wavelengths in parallel. A 3-D spectrum, for example, such as wavelength and two different angles, can be measured, which contains more information than a 2-D spectrum. This allows more information to be measured that increases metrology process robustness. This is described in more detail in European Patent No. 1,628, 164A, which is incorporated by reference herein in its entirety.

The target 30 on substrate W may be a 1-D grating, which is printed such that after development, the bars are formed of solid resist lines. The target 30 may be a 2-D grating, which is printed such that after development, the grating is formed of solid resist pillars or vias in the resist. The bars, pillars or vias may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. Accordingly, the scatterometry data of the printed gratings is used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other scatterometry processes.

Figure 5:
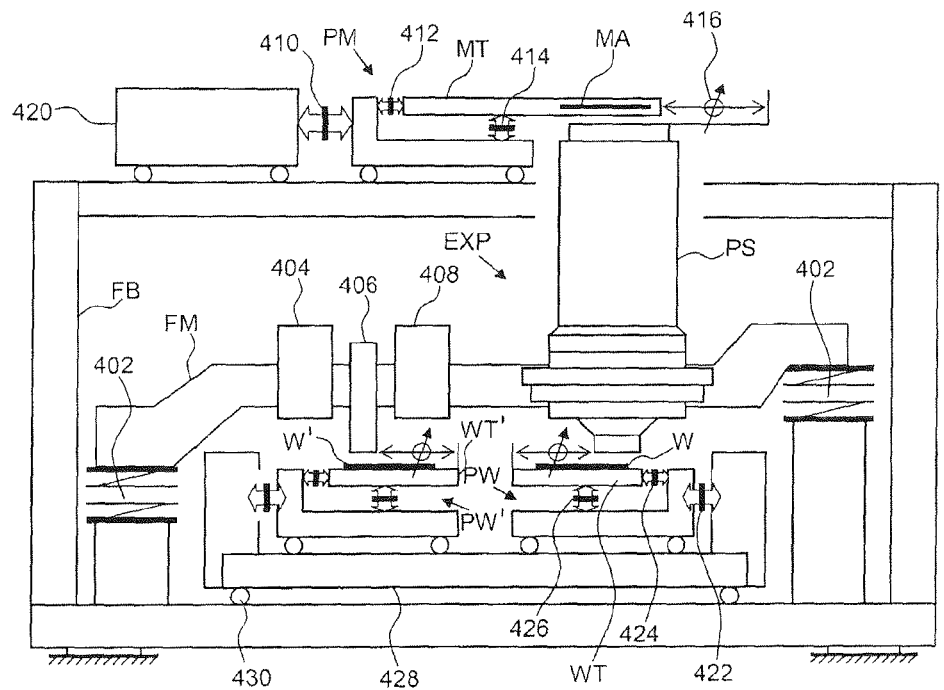
FIG. 5 is a schematic diagram showing components of a lithographic apparatus having separate measurement and exposure stages, according to an embodiment of the present invention.

FIG. 5, according to an embodiment of the present invention, shows schematically the arrangement of one embodiment of the apparatus of FIG. 1, in which the apparatus is of the type having dual substrate supports and separate metrology and exposure stations.

A base frame FB supports and surrounds the apparatus on the ground. Within the apparatus, and serving as an accurate positional reference, a metrology frame FM is supported on air bearings 402, which isolate it from vibrations in the environment. Mounted on this frame are the projection system PS, which naturally forms the core of the exposure station EXP, and also instruments 404, 406, 408, which are the functional elements of the metrology station MET. Above these stations, the mask table MT and mask MA are mounted above the projection system PS. The first positioner PM comprises long-throw, e.g., coarse, actuators 410 and short-throw, e.g., fine, actuators 412 and 414. These operate by active feedback control to obtain the desired position of mask MA with respect to the projection system PS, and hence with respect to metrology frame FM. This measurement is indicated schematically at 416. The whole positioning mechanism for the mask MA is supported on the base frame at B via active air bearings 418 etc. A balance mass 420 is provided to mimic at least coarse movements of the mask table MT and positioning, to reduce vibrations being transmitted into the frame and other components. A low frequency servo control keeps balance mass 420 in a desired average position. Wafer table WT shown beneath the projection system similarly has coarse actuators 422 and fine actuators 424, 426 for positioning substrate W accurately with respect to the exit lens of the projection system PS. Additionally, according to the dual-stage arrangement of this example, a duplicate wafer table WT' and positioning mechanism PW' are provided. As illustrated, these duplicate elements are supporting a second substrate W' at the metrology station MET. Wafer tables WT, WT' and their respective positioners PW and PW' are carried on and connected to a shared balance mass 428. Again, air bearings, or other suitable bearings such as magnetic, electrostatic and so forth, are shown schematically, for example at 430. Measurements of wafer table position used for the coarse and fine control of the positions of the wafers W and W' are made relative to elements 406 at the metrology station and PS at the exposure station, both of these ultimately referring back to metrology frame FM.

Figure 6:
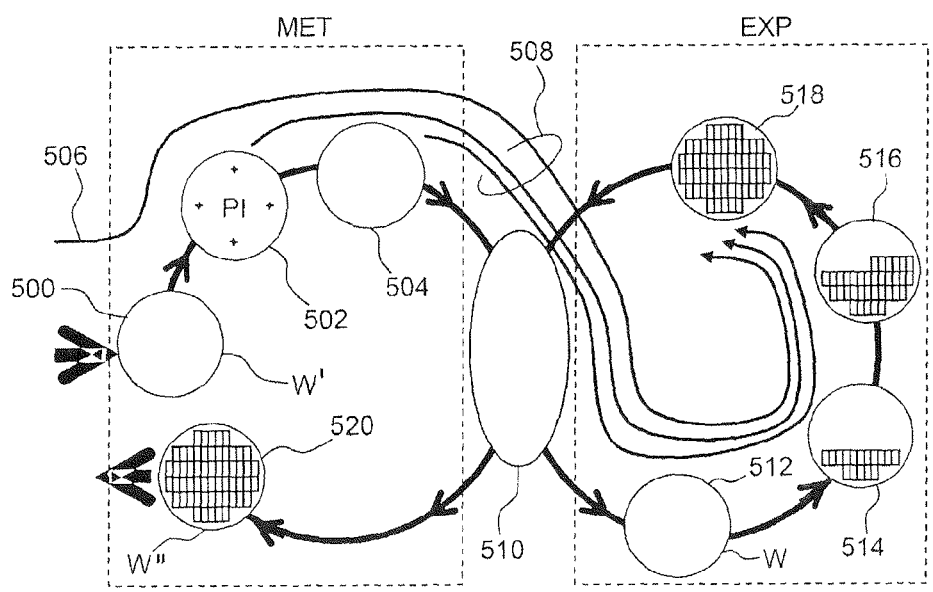
FIG. 6 illustrates schematically the stages in the measurement and exposure processes in the apparatus of FIG. 5, according to known practice, according to an embodiment of the present invention.

FIG. 6, according to an embodiment of the present invention, illustrates the steps in this twin-stage apparatus of FIG. 5 to expose dies on a substrate W. On the left hand side within a dotted box are steps performed at metrology station MET, while the right hand side shows steps performed at the exposure station EXP. A substrate W has already been loaded into the exposure station. A new substrate W' is loaded to the apparatus by a mechanism not shown at step 500. These two substrates are processed in parallel in order to increase the throughput of the metrology process as a whole. Referring initially to the newly-loaded substrate W', this may be a previously unprocessed substrate, prepared with a new photo resist for first time exposure in the apparatus. In general, however, the lithography process described will be merely one step in a serious of exposure and processing steps, so that substrate W' has been through this apparatus and/or other lithography apparatus several times already, and may have subsequent processes to undergo as well. At 502, alignment measurements using the substrate marks P1 etc. and image sensors etc. are used to measure and record alignment of the substrate relative to substrate table WT. In practice, several marks across the substrate W' will be measured, to establish the "wafer grid," which maps very accurately the distribution of marks across the substrate, including any distortion relative to a nominal regular grid. At step 504, a map of wafer height against X-Y position is measured also, for use in accurate focusing of the exposed pattern.

When substrate W' was loaded, recipe data 506 are received, defining the exposures to be performed, and also properties of the wafer and the patterns previously made and to be made upon it. To these recipe data are added the measurements made at 502, 504, so that a complete set of recipe and metrology data 508 can be passed to the exposure stage. At 510, wafers W' and W are swapped, so that the measured substrate W' becomes the substrate W entering the exposure apparatus. This swapping is performed by exchanging the supports WT and WT' within the apparatus, so that the substrates W, W' remain accurately clamped and positioned on those supports, to preserve relative alignment between the substrate tables and substrates themselves. Accordingly, once the tables have been swapped, determining the relative position between projection system PS and substrate table WT (formerly WT') is all that is necessary to make use of the measurement information 502, 504 for the substrate W (formerly W') in control of the exposure steps. At step 512, reticle alignment is performed using mask alignment marks. In steps 514, 516, 518, scanning motions and radiation pulses are applied at successive die locations across substrate W, in order to complete the exposure of a number of patterns. Thanks to the alignment and level map data, these patterns are accurately aligned with respect to desired locations, and, in particular, with respect to features previously laid down on the same substrate. The exposed substrate, now labeled W" is unloaded from the apparatus at step 520, to undergo etching or other processes, in accordance with the exposed pattern.

By employing the separate substrate tables, the performance of the apparatus in terms of substrate throughput through the exposure stages is maintained, while permitting a relatively time-consuming set of measurements to be performed to characterize the wafer and patterns previously deposited upon it.

As mentioned above, the wafer table WT shown in FIG. 1 and wafer tables WT, WT' shown in FIG. 5 have coarse actuators 422 and fine actuators 424, 426 for positioning substrate W accurately with respect to the exit lens of the projection system PS.

Figure 7:
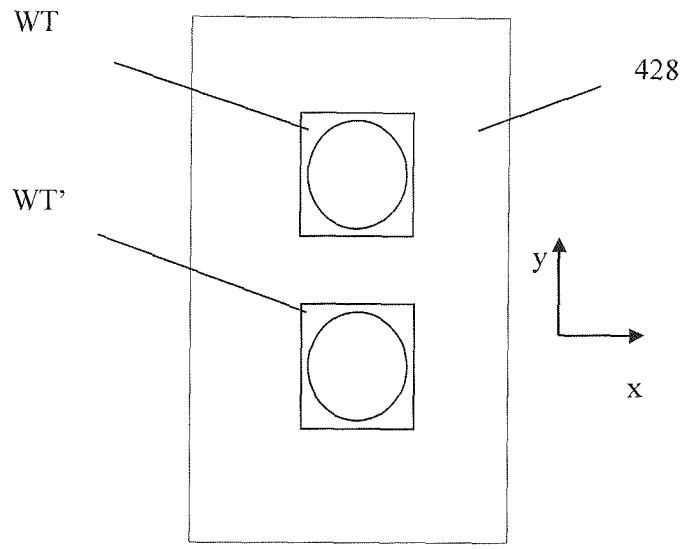
FIG. 7 depicts a first example of an arrangement for moving wafer stages on a substrate, according to an embodiment of the present invention.

There are different known mechanisms for moving the wafer table and mask tables and for measuring their positions. One such system (referred to herein as NXT) is schematically illustrated in FIG. 7, according to an embodiment of the present invention, and uses a planar motor to drive the two wafer tables WT and WT'. The balance mass 428 in this embodiment comprises a magnet plate, and the undersides of the wafer tables WT and WT' comprise force actuators for movement of the tables in the x, y and z directions (the z direction being out of the plane of the page). In the system of the type illustrated in FIG. 7, the position of the tables WT and WT' is measured via encoders that are located on the underside of a metrology frame (shown as FM in FIG. 5), and an image sensor is provided on the relevant wafer chuck to monitor the position via the encoders of the tables. The encoders cooperate to output a location of the wafer tables in (x,y) coordinates.

Figure 8:
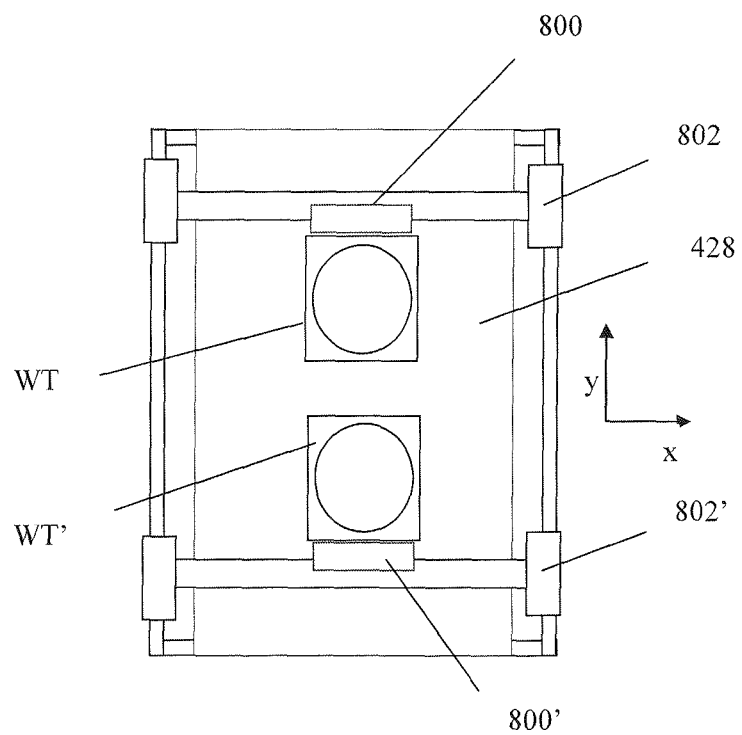
FIG. 8 depicts a second example of an arrangement for moving wafer stages on a substrate, according to an embodiment of the present invention.

An alternative embodiment of the present invention is shown in FIG. 8 (referred to herein as XT). Here the positions of the wafer tables WT, WT' on the balance mass 428 are controlled via actuators 800, 800' for moving the tables in an x direction (left and right as shown in the figure) and actuators 802, 802' for moving the tables in a y direction, e.g., up and down as shown in the figure. The positions of the tables WT, WT' are measured by interferometers that project beams onto mirrored side wall surfaces of the wafer tables. Typically an "x" interferometer provides the location of one wafer table in an x axis, and a "y" interferometer provides the location of one wafer table in a y-axis. Each of the "x" and "y" interferometers may comprise transmitters at both sides of the balance mass 428, arranged to direct interferometer beams towards opposing sides of the wafer tables.

A key component of accurate lithography is an increased ability to control lithography scanners and scanning functionality. When referring to "scanners" it should be appreciated that this encompasses all the scan modes and functionality described herein, and other scanning functionalities. Improvements to the scanner's focus and overlay, e.g., layer-to-layer alignment, uniformity have recently been achieved by the applicant's Baseliner™ scanner stability module, leading to an optimized process window for a given feature size and chip application, enabling the continuation the creation of smaller, more advanced chips.

When a lithography system is first installed, it must be calibrated to ensure optimal operation. However, over time, system performance parameters will drift. A small amount of drift can be tolerated, but too much drift and the system will go out of specification. Consequently manufacturers are required to stop production periodically for re-calibration. Calibrating the system more frequently gives a bigger process window, but at the cost of more scheduled downtime.

The scanner stability module greatly reduces these production stoppages. Instead, it automatically resets the system to a pre-defined baseline each day. To do this it retrieves standard measurements taken from a monitor wafer using a metrology tool. The monitor wafer is exposed using a special reticle containing special scatterometry marks. From that day's measurements, the scanner stability module determines how far the system has drifted from its baseline. It then calculates wafer-level overlay and focus correction sets. The lithography system then converts these correction sets into specific corrections for each exposure on subsequent production wafers.

For volume production, it is desirable to have full flexibility when assigning layers for exposure to a scanner. The alternative, layer-scanner dedication, would put monthly output capacity at risk, since any small disturbance of the lithocluster directly shows up in the output of that month. One possible approach to overcome this risk is by overlay grid matching. All scanner grids are intentionally offset a little, such that all scanners more or less have the same, or average, grid for overlay. This grid is often referred to as 'holy' or 'golden' grid. Each product layer can now be exposed on each scanner of the same type. This 'golden' grid is exposed and etched onto so called 'reference wafers'. If these 'golden' matching wafers are used as the baseline for overlay stability control instead of random monitoring wafers, overlay grid matching and long-term stability can be achieved in a single automated step.

Figure 9:
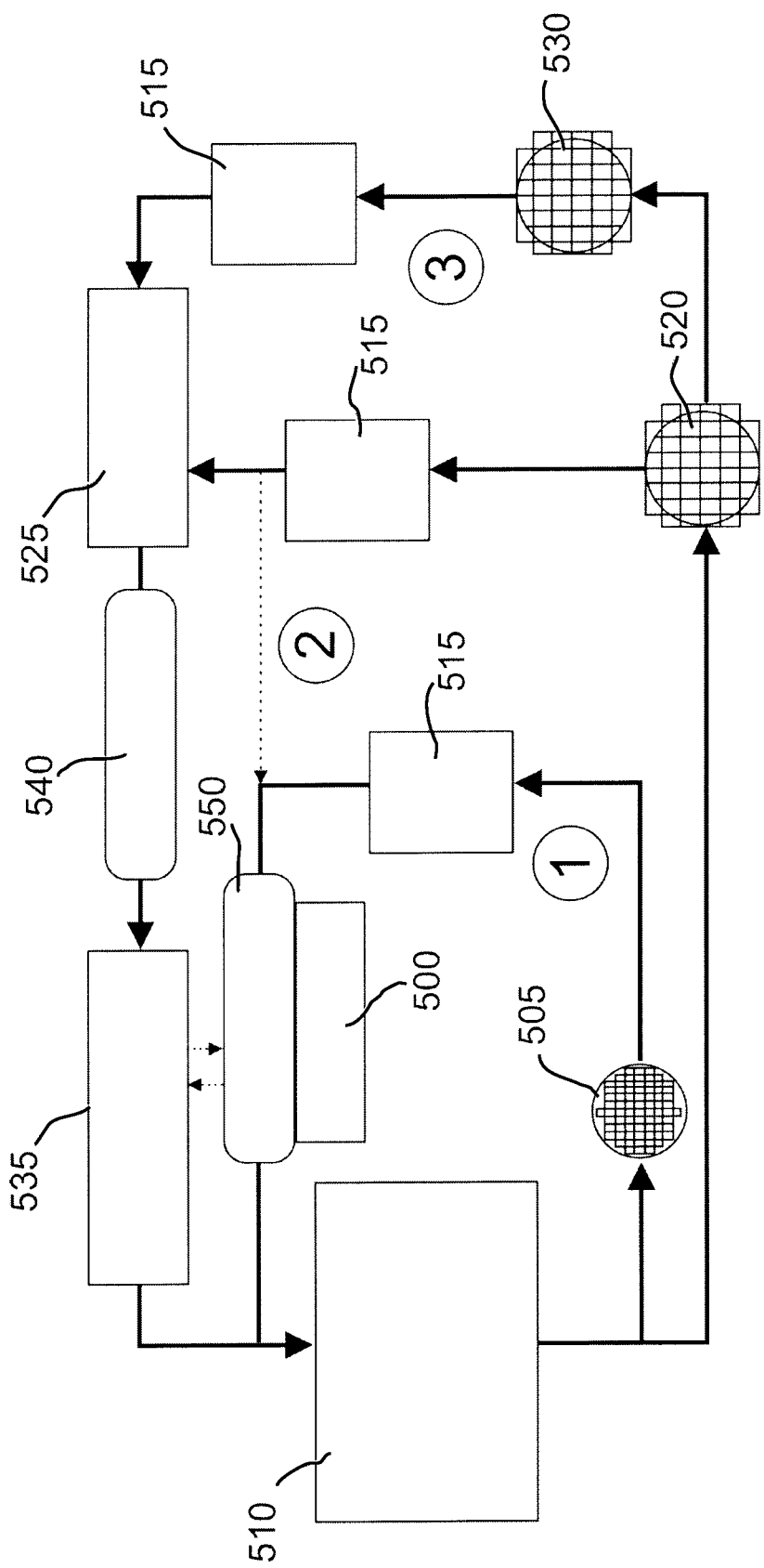
FIG. 9 illustrates the control loops in a lithographic process utilizing a scanner stability module, according to an embodiment of the present invention.

FIG. 9, according to an embodiment of the present invention, depicts the overall lithography and metrology method incorporating the scanner stability module 500, for example, essentially an application running on a server. Shown are three main process control loops. The first loop provides the local scanner control using the scanner stability module 500 and monitor wafers. The monitor wafer 505 is shown being passed from the main lithography unit 510, having been exposed to set the baseline parameters for focus and overlay. At a later time, metrology unit 515 reads these baseline parameters, which are then interpreted by the scanner stability module 500 so as to calculate correction routines 550 that are passed to the main lithography unit 510, and used when performing further exposures.

The second (APC) loop is for local scanner control on-product (determining focus, dose, and overlay). The exposed product wafer 520 is passed to metrology unit 515 and then onto the Advanced Process Control (APC) module 525. Data from the metrology unit 515 is again passed to the scanner stability module 500. Process corrections 540 are made before the Manufacturing Execution System (MES) 535 takes over, providing scanner control to the main lithography unit 510, in communication with the scanner stability module 500.

The third loop is to allow metrology integration into the second APC loop (e.g., for double patterning). The post etched wafer 530 is passed to metrology unit 515 and then onto the Advanced Process Control (APC) module. The loop continues the same as with the second loop.

The present invention relates to embodiments for controlling exposure by a lithographic apparatus, for example a scanner, in order to reduce errors in the lithographic process, for example overlay.

Scanner Errors

The following overlay errors have been identified to be significant causes of errors to be corrected via a scanner stability module application:

1. Positioning drift (mirrors for XT and grid plates/encoders for NXT).

2. Scan up/down and step left/right effects that show up as mirror deformation dependent on a movement for XT and movement dependent encoder offsets for NXT. See the discussion of FIGS. 7 and 8 above for description of the NXT and XT systems.

3. Wafer deformation induced by the drift in wafer clamping fingerprint as well as in wafer deformation during exposure.

4. Field fingerprint drift (e.g., due to lens or reticle stage drift).

5. Scan direction dependent intrafield fingerprint ("wiggle" effect due to, for example, dynamic lens disturbance).

Model

A model to correct these errors assumes:

1. Low frequency drift on positioning errors that is positioning type specific
   a. Mirror deformation (XT): one dimensional polynomials $dx{\sim}P\_n(y)$ and $dy{\sim}P\_n(x)$ (XT positioning concept) per chuck.
   b. Encoder/grid plate deformation (NXT) will be determined via polynomial on position dependent encoder offset: $dh(x,y){\sim}P\_n(x,y)$ where dx and dy are determined as $(dx,dy){\sim}$Encoder model$(dh(x,y))=$Encoder model$(P\_n(x,y))$. 2D polynomial representation will be used for each encoder.

2. Scan up/down and step left/right errors are the same in absolute value (for the same position) with opposite sign. These errors describe change of the positioning and deformation depending on move history. To reduce the noise of the calibration, it is also assumed that these errors have low frequent nature. For XT, these positioning and deformation errors are represented via polynomials. For NXT, positioning is determined from the encoder signal that is located on a specific place of a chuck. Therefore, to describe scan/step dependent errors, only errors on the encoders have to be taken into the consideration and not the total deformation of a chuck. Hence, for NXT we consider scan/step dependent positioning errors as being move dependent encoder offsets. Wafer deformation dependent errors are considered to be similar for XT/NXT system types as they are positing independent.

3. The rest of two dimensional errors that depend on position on the wafer are described via a 2D polynomial and it represents a wafer grid deformation.

4. Field fingerprint induced by lens/RS is constant for all fields and is orthogonal to the rest of the errors.

5. Scan direction dependent intrafield errors will be described as low frequent reticle stage positioning errors via three one dimensional polynomials: $dx{\sim}P\_n(y)$, $dy{\sim}P\_n(y)$, $dy{\sim}x*P\_n(y)$ (this represents rotation errors).

This concept of determining overlay errors does not ensure absolute correctness of the calibrated parameters. It makes sure that the parameters that are determined are independent and they are correct for the application range of a scanner (dynamic exposures for a typical field size). Also, one dimensional mirror shape calibration is made orthogonal to two dimensional wafer deformation by not taking into 2D wafer deformation terms that could be caused by mirror shape.

Positioning Errors

If a mirror deformation is present, it would affect exposures independently on scan or step direction. Hence, the polynomial model for the mirror would look like $$dx(y\_w)=\text{Sum}(a\_n*y\_w\char`\^n)$$

$$dy(x)=\text{Sum}(b\_n*x\char`\^n)$$

where x is the x coordinate of a central point of a field and y_w is the y coordinate of scatterometer target marks. This represents physical positioning errors produced by XT scanner.

The NXT model for positioning error is more complex. As each of the encoders can influence both x and y offset, the model becomes two dimensional. Moreover, it has to be determined separately for each encoder/grid plate $$(dx,dy)=\text{Encoder\_model}(\text{Sum}(\text{Sum}(c\_i\_n\_m*x\char`\^n*y\char`\^m)))$$

where an i notes an encoder i

Scan/Step Dependent Errors

Scan up/down and step left/right errors could be induced by a deformation of an exposure chuck or wafer. In this case, the deformation will result in deforming mirrors for different moves (XT) or shifted encoder position (NXT). Hence, to describe XT scan up/down and step left/right effects, the following polynomials are used $$dx\_\text{up}(y)=\text{Sum}(d\_n*y\char`\^n)$$

$$dx\_\text{down}(y)=-dx\_\text{up}(y)$$

$$dy\_\text{up}(x)=\text{Sum}(e\_n*x\char`\^n)$$

$$dy\_\text{down}(x)=-dy\_\text{up}(x)$$

$$dx\_\text{left}(y)=\text{Sum}(f\_n*y\char`\^n)$$

$$dx\_\text{right}(y)=-dx\_\text{left}(y)$$

$$dy\_\text{left}(x)=\text{Sum}(g\_n*x\char`\^n)$$

$$dy\_\text{right}(x)=-dy\_\text{left}(x)$$

where (x,y) is position of an exposed field (central point). For NXT, the following description can be used:

$$(dx\_\text{up},dy\_\text{up})=\text{Encoder model}(h\_\text{up})$$

$$(dx\_\text{left},dy\_\text{left})=\text{Encoder model}(h\_\text{left})$$

$$(dx\_\text{down},dy\_\text{down})=-(dx\_\text{up},dy\_\text{up})$$

$$(dx\_\text{right},dy\_\text{right})=-(dx\_\text{left},dy\_\text{left})$$

Also, during an exposure, deformation of wafer or wafer table could be expected. To describe the wafer and wafer table deformation two dimensional polynomial model is used:

$$dx\_\text{up}=\text{Sum}(u\_n\_m*x\char`\^n*y\char`\^m)$$

$$dy\_\text{up}=\text{Sum}(v\_n\_m*x\char`\^n*y\char`\^m)$$

$$dx\_\text{down}(x,y)=-dx\_\text{up}(x,y)$$

$$dy\_\text{down}(x,y)=-dy\_\text{up}(x,y)$$

Wafer Deformation

The rest of the grid errors are considered to be induced by wafer deformation that could have mechanical or thermal nature. The wafer could be deformed statically by, for example, forces during wafer clamp or the wafer could be deformed during exposure. As a normal system usage is an exposure, we could assume that wafer deformation by an exposure should not deviate much between products and calibration if calibration layout of BL is chose to be a "typical" (number of fields, field size, normal exposure)

Hence, the description of the wafer deformation would be $$dx=\text{Sum}(\text{Sum}(r\_n\_m*x\char`\^n*y\char`\^m))$$

$$dy=\text{Sum}(\text{Sum}(s\_n\_m*x\char`\^n*y\char`\^m))$$

where (x,y) position of an YS mark on the wafer

Also, this model could be extended for applications like double patterning where one wafer is exposed in two passes, e.g., images. In this case, a second, or more, images can have different deformation due to, for example, thermal disturbance. For these applications, wafer deformation could be calibrated accordingly by performing multiple exposures on one wafer and determining wafer deformation (as described above) per an exposure pass Field Errors The field correction model can be described as follows (notation $P\_n(x)=Sum(a\_n*x^n)$):

$$dx\sim P\_n(x)(n<4)$$

$$dx\sim P\_n(y)$$

$$dy\sim P\_n(x)(n<3)$$

$$dy\sim P\_n(y)$$

$$dy\sim x*P\_n(y)$$

With the extension of the correction mechanism with induction of lens errors dependent on y (by scanning lens elements or focus offsets) we can extend intrafield corrections only by adjusting a lens or focus offset during the scanning operation, thus errors like:

$$dx\sim P\_n\_m(x,y)=Sum(t\_n\_m*x^n*y^m), n<4$$

$$dy\sim P\_n\_m(x,y)=Sum(w\_n\_m*x^n*y^m), n<3$$

could also be corrected. Note, that errors that are proportional to power of x could only be corrected by adjusting lens elements and therefore have limited correction capabilities.

Scan Direction Dependent Field Errors

Scan direction errors assumes that scan disturbance occur on the reticle stage that affect positioning of the reticle. These error induce scan direction depend positioning fingerprint that will be corrected as:

$$dx\_up\sim P\_n(y)$$

$$dy\_up\sim P\_n(y)$$

$$dy\_up\sim x*P\_n(y)$$

$$dx\_down=-dx\_up$$

$$dy\_down=-dy\_up$$

on a field level.

Method for Model Parameters Estimation

These effects will be determined from the measured data as following
1. Firstly, the field distortion is determined (intrafield errors). Based on the knowledge of a scanner error, we can assume that field distortion caused by reticle stage or lens and it is independent from the rest of the grid errors
2. Determine scan/step direction error (wafer and reticle stage positioning errors). As the effect of these errors on the overlay would have a high frequency nature (neighboring fields will show significant change), these errors could be determined separately from the position and deformation error (neighboring fields will show a slight change). Stitching data or measured overlay data could be used to determine these errors Thus there are several ways to determine these errors.
3. Determine positioning and deformation errors simultaneously on the residuals data of scan/step direction calibration. Unlike the field and scan/step direction errors, errors in positioning and wafer deformation could not be strongly decoupled. Hence, these have to be determined simultaneously to provide the best correction. Optionally, scan/step direction error could also bet determined simultaneously with the grid errors. Independent reference can be used here, for example, etched reference wafers To be able to determine the correction, sufficient number of points has to be measured for a field (~7 in x and y coordinate). Also, exposure pattern has to be chosen such that it is representative for scan/step direction Correction Method The correction method according to an embodiment of the present invention is a combination of all the above modeled parameters being applied separately to different subsystems of a scanner:
1. Positioning errors are corrected by low-level positing controllers to be able to correct for fast grid change within one exposure. This would give the best performance on the executing on the correction. It is new functionality.
2. Scan/step direction dependent errors are corrected by positioning or metrology controllers. Also, as in step 1, if errors need to be corrected for a rapid change within a field, it is performed on a low-level positioning module.
3. Grid deformation errors may be corrected by adjusting setpoints for exposed fields.
4. Field errors may be corrected by adjusting lens/reticle stage setpoints.
5. Scan dependent reticle stage positioning fingerprint (YTX, YTY and YRZ) may be corrected in a scanning driver as direction dependent reticle stage scan map correction.

With reference to FIG. 10, according to an embodiment of the present invention, a method of controlling a lithographic apparatus is illustrated according to an embodiment of the present invention.

A lithographic exposure process 1000 is performed 1002 on a substrate 1004 using a scanner 1006. The scanner comprises several subsystems 1008, 1010, 1012. There are errors in the overlay arising from the subsystems during the exposure. The overlay errors are measured 1014 using a scatterometer to obtain overlay measurements 1016. Modeling is performed 1018 to separately determine from the overlay measurements different subsets of estimated model parameters, for example field distortion model parameters 1020, scan/step direction model parameters 1022 and position/deformation model parameters 1024. Each subset is related to overlay errors arising from a corresponding specific subsystem of the lithographic apparatus, as described above. Finally, the exposure is controlled 1026 in the scanner 1006 by controlling a specific subsystem 1008, 1010, 1012 of the scanner using its corresponding subset of estimated model parameters, 1024, 1022, 1020 respectively. This results in a product wafer 1028 being exposed with a well controlled overlay 1030.

By considering overlay errors so as to take into account specific fingerprints of scanner errors, the application of embodiments of the present invention leads to more effective maintenance. Providing knowledge about scanner specific errors to an offline modeling application in accordance with an embodiment of the present invention increases accuracy of the maintenance. Hence, there is less need to perform on-line re-calibration on a system that also benefits from decreased maintenance time. Embodiments of the present invention provide effective maintenance that does not require scanner time to perform extensive measurements Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens," where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g., semiconductor memory, magnetic or optical disk) having such a computer program stored therein.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building storing blocks illustrating the implementation of specified functions and relationships thereof. The boundaries of these functional building storing blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A method of controlling a lithographic apparatus comprising:
    measuring a substrate property arising from a lithographic process to obtain a substrate property measurement;
    determining a first subset of estimated model parameters of a scanning system of the lithographic apparatus based on the substrate property measurement, the first subset of estimated model parameters being related to a positioning error and a substrate deformation error in the substrate property, the positioning error arising from a positioning subsystem of the seaming system and the substrate deformation error arising from a mechanical or thermal subsystem of the scanning system;
    substantially simultaneously determining the positioning error and the substrate deformation error; and
    controlling the positioning subsystem and the mechanical or thermal subsystem based on the first subset of estimated model parameters.

2. The method of claim 1, further comprising determining a second subset of estimated model parameters of the scanning system based on the substrate property measurement, the second subset of estimated model parameters being related to a field distortion error in the substrate property, the field distortion error arising from a field scanning subsystem of the scanning system.

3. The method of claim 2, further comprising controlling the field scanning subsystem based on the second subset of estimated model parameters.

4. The method of claim 1, further comprising determining a second subset of estimated model parameters of the scanning system based on the substrate property measurement, the second subset of estimated model parameters being related to a scan direction dependent field error in the substrate property, the scan direction dependent field error arising from a scan direction subsystem of the scanning system.

5. The method of claim 4, further comprising controlling the scan direction subsystem based on the second subset of estimated model parameters.

6. The method of claim 4, further comprising substantially simultaneously determining the scan direction dependent field error and the substrate deformation error.

7. A lithographic apparatus comprising:
    an inspection apparatus configured to measure a substrate property arising from a lithographic process to obtain a substrate property measurement; and
    a processor configured to:
        determine a first subset of estimated model parameters of a scanning system of the lithographic apparatus based on the substrate property measurement, the first subset of estimated model parameters being related to a positioning error and a substrate deformation error in the substrate property, the positioning error arising from a positioning subsystem of the scanning system and the substrate deformation error arising from a mechanical or thermal subsystem of the scanning system;

substantially simultaneously determine the positioning error and the substrate deformation error;

control the positioning subsystem and the mechanical or thermal subsystem based on the first subset of estimated model parameters.

8. The lithographic apparatus of claim 7, wherein the processor is further configured to determine a second subset of estimated model parameters of the scanning system based on the substrate property measurement, the second subset of estimated model parameters being related to a field distortion error in the substrate property, the field distortion error arising from a field scanning subsystem of the scanning system.

9. The lithographic apparatus of claim 8, wherein the processor is further configured to control the field scanning subsystem based on the second subset of estimated model parameters.

10. The lithographic apparatus of claim 7, wherein the processor is further configured to determine a second subset of estimated model parameters of the scanning system based on the substrate property measurement, the second subset of estimated model parameters being related to a scan direction dependent field error in the substrate property, the scan direction dependent field error arising from a scan direction subsystem of the scanning system.

11. The lithographic apparatus of claim 10, wherein the processor is further configured to control the scan direction subsystem based on the second subset of estimated model parameters.

12. The lithographic apparatus of claim 10, wherein the processor is further configured to substantially simultaneously determine the scan direction dependent field error and the substrate deformation error.

13. A non-transitory computer program product containing a sequence of machine-readable instructions for controlling lithographic processing by a lithographic apparatus used to perform a lithographic process on a substrate, the instructions being adapted to cause a processor to perform operations comprising:

receiving a substrate property measurement arising from the lithographic process;

determining a first subset of estimated model parameters of a scanning system of the lithographic apparatus based on the substrate property measurement, the first subset of estimated model parameters being related to a positioning error and a substrate deformation error in the substrate property, the positioning error arising from a positioning subsystem of the scanning system and the substrate deformation error arising from a mechanical or thermal subsystem of the scanning system;

substantially simultaneously determining the positioning error and the substrate deformation error; and controlling the positioning subsystem and the mechanical or thermal subsystem based on the first subset of estimated model parameters.

* * * * *

UNITED STATES PATENT AND TRADEMARK OFFICE
CERTIFICATE OF CORRECTION

PATENT NO. : 9,310,698 B2  
APPLICATION NO. : 13/012386  
DATED : April 12, 2016  
INVENTOR(S) : Menchtchikov et al.

Page 1 of 1

It is certified that error appears in the above-identified patent and that said Letters Patent is hereby corrected as shown below:

Claims

In Column 18, line 30, claim 1, please delete "seaming" and insert --scanning--.

Signed and Sealed this  
Nineteenth Day of July, 2016

Michelle K. Lee  
*Director of the United States Patent and Trademark Office*